FABRICATION OF SEMICONDUCTOR DEVICES

Filed July 23, 1963 2 Sheets-Sheet 1

INVENTORS
PAUL P. CASTRUCCI
ROBERT M. FOLSOM
WALDEMAR A. PIECZONKA

BY Owen Lamb

AGENT

FABRICATION OF SEMICONDUCTOR DEVICES

Filed July 23, 1963 2 Sheets-Sheet 2

United States Patent Office 3,279,963

Patented Oct. 18, 1966

3,279,963

FABRICATION OF SEMICONDUCTOR DEVICES

Paul P. Castrucci, Robert M. Folsom, and Waldemar A. Pieczonka, Poughkeepsie, N.Y., assignors to International Business Machines Corporation, New York, N.Y., a corporation of New York Filed July 23, 1963, Ser. No. 297,026
6 Claims. (Cl. 148—188)

This invention relates to the fabrication of semiconductor devices and more particularly to the formation of junctions between materials of differing conductivity types in such devices.

Semiconductor devices used in nonsaturating solid state circuits must have the ability to supply the power needed for switching memory storage elements, such as ferrite cores and thin films. In such devices, a compromise between power handling ability and switching speed must be made. The voltage swing and the current switched must be large enough to permit as many memory elements as possible to be handled by one device, while the switching time must be as short as possible. Further, the saturation-voltage drop must be sufficiently low to prevent destruction of the device due to excessive power dissipation.

A major problem in the fabrication of a germanium NPN mesa transistor for use in solid state memory element switching applications has been the existence of the high saturation voltage ($V_{ce}$) that results when a collector bulk resistivity is chosen that will yield a high collector-junction reverse breakdown characteristic ($BV_{cbo}$). For low voltage applications ($BV_{cbo}$ less than 60 volts), a double-diffused structure in a relatively low resistivity material, for example 1 ohm-centimeter, results in low saturation-voltage drops without any special treatment of the collector bulk region. However, for medium to high voltage applications ($BV_{cbo}$ of 100 to 150 volts) the resistivity of the collector bulk needed to achieve these breakdowns is too high to also obtain low saturation voltage drops. It is therefore necessary to alter the collector bulk material.

One way of reducing the bulk resistivity is to use a thin starting wafer, for example a wafer having a one mil thickness. However, such thicknesses are very difficult to handle in production processes, because they are very fragile.

Several methods utilizing relatively thick starting wafers have been used in the past. In the epitaxial approach, an epitaxial layer is grown on one face of a starting wafer. The wafer is then heated and subjected to a vapor carrying an impurity to cause simultaneous diffusion from the epitaxial layer and the vapor into opposite sides of the wafer. This method is widely used in fabricating PNP type transistors. However, using an epitaxial approach to fabricating an NPN transistor would require the growth of a thick layer of high resistivity material on a low resistivity substrate, which is extremely difficult to accomplish. Further, since N-type materials diffuse much faster into germanium than P-type materials, control of impurity penetration is extremely difficult when working with epitaxial layers.

One prior approach which avoids epitaxial techniques employs a separate back diffusion step to reduce the resistivity, followed by a separate base diffusion. This approach is inherently undesirable because during the subsequent base diffusion, further diffusion from the back diffusion source occurs, thus causing a cumulative penetration of impurity which is very deep. This results in an altered impurity distribution and hence a bulk resistance that is too high.

Another prior approach which avoids epitaxial techniques involves an alloy process. The starting material is a wafer of a semiconductor material doped to a desired level. An alloying dot containing an impurity is then pressed on one side of the wafer. The dot may be, for example, lead doped with antimony. A diffusion of the base is then performed by evaporation techniques, while at the same temperature antimony diffuses from the lead, to thereby reduce the collector bulk resistivity. This approach has several drawbacks. First, it is extremely difficult to control the depth of penetration. Secondly, the segregation coefficient of lead is such that the antimony has a greater preference for lead than it does for germanium. Therefore, the surface concentration of antimony remains low yielding a high bulk resistivity. Further, the diffusant from the evaporation source contaminates the lead side of the wafer. A protective-film cover on that side of the wafer cannot be used because it would crack due to the action of the lead during diffusion. A further disadvantage of this process is that the lead-antimony dot does not remain in the solidus phase at the diffusion temperature. This results in alloy formation at the dot-substrate interface causing a non-uniform diffusion front.

It is a paramount object of this invention to provide an improved method of diffusing impurities into a semiconductive body.

It is an object of this invention to provide an improved method of fabricating an NPN transistor having a low extrinsic collector-bulk resistivity and high collector-junction reverse breakdown characteristic.

It is another object of this invention to provide an improved method of fabricating a transistor having a low extrinsic collector-bulk resistivity which permits the use of a relatively thick starting wafer.

It is a further object of this invention to provide an improved method of fabricating an NPN transistor having a low collector-bulk resistivity without having to employ epitaxial techniques.

It is a still further object of this invention to provide an improved method for fabricating a diffused NPN device which does not result in a deep cumulative penetration of the back diffusant.

It is another further object of this invention to provide an improved process for fabricating a diffused NPN transistor which results in a uniform diffusion front.

Briefly stated, the above objects are accomplished by utilizing a novel process for diffusing impurities into a semiconductive wafer. In accordance with one aspect of the invention, a semiconductive film doped with an impurity is evaporated onto one face of the wafer, which is comprised of the same semiconductive material as that in the film. The wafer is then heated to cause diffusion of the impurity from the film into the wafer.

Where several junctions are desired, two such films are deposited on opposite sides of the wafer, and the two diffusions carried out simultaneously.

In accordance with another aspect of the invention, after a first film has been evaporated onto one side of the wafer, the film is covered with a protective coating. The wafer is then heated in a vapor diffusion furnace wherein the diffusant is a second impurity. Simultaneously, the first impurity diffuses into the first side of the wafer from the evaporated film and the second impurity diffuses into those areas of the wafer which are not covered by the protective layer.

The invention overcomes many disadvantages inherent in diffusions from evaporated metal films and diffusions from gaseous phases. For example, the invention has the advantage that there is no alloy formation at the film substrate interface, because the dopant concentration of the film is such that the film remains in the solidus phase over the entire working temperature. The absence of an alloy phase results in a uniform diffusion front.

The invention has the further advantage that the maximum dopant concentration at the surface of the substrate is limited only by solid solubility rather than segregation coefficient as is the case when diffusion is from alloy fronts.

The invention also has the advantage that diffusion source films of either opposite or like conductivity types may be evaporated on opposite faces of the substrate and the two diffusions may be performed simultaneously.

The result is a simple, effective and low-cost process for fabricating a high-speed, high-voltage, medium power transistor.

The foregoing and other objects, features and advantages of the invention will be apparent from the following and more particular description of a preferred embodiment of the invention, as illustrated in the accompanying drawings.

Figure 4:
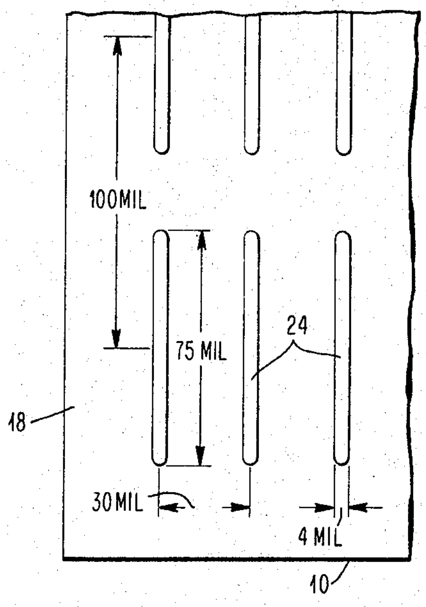
FIG. 4 is a bottom view of the wafer with a water-soluble salt evaporated thereon through a metallic emitter mask.
Figures 5A, 5B, 5C:
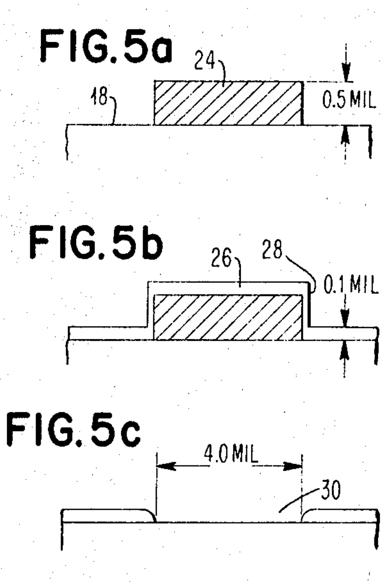
Figure 6:
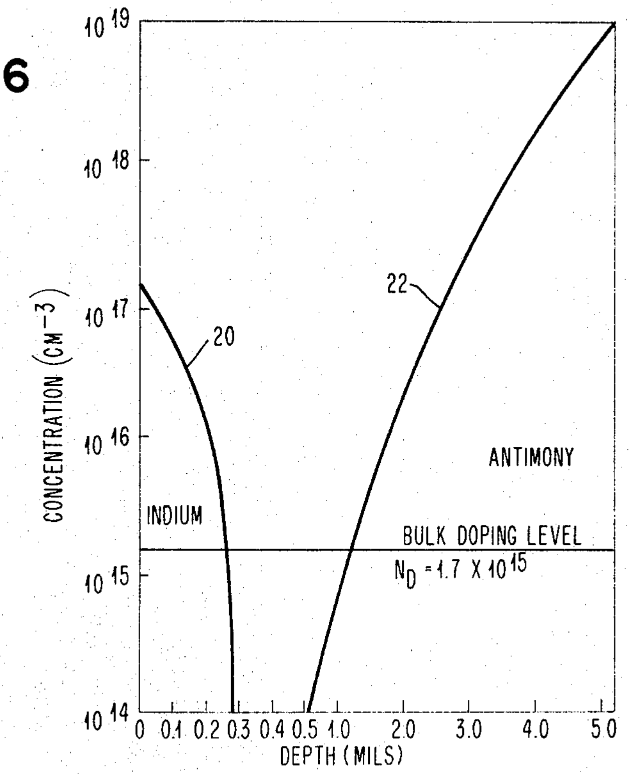
Figure 7:
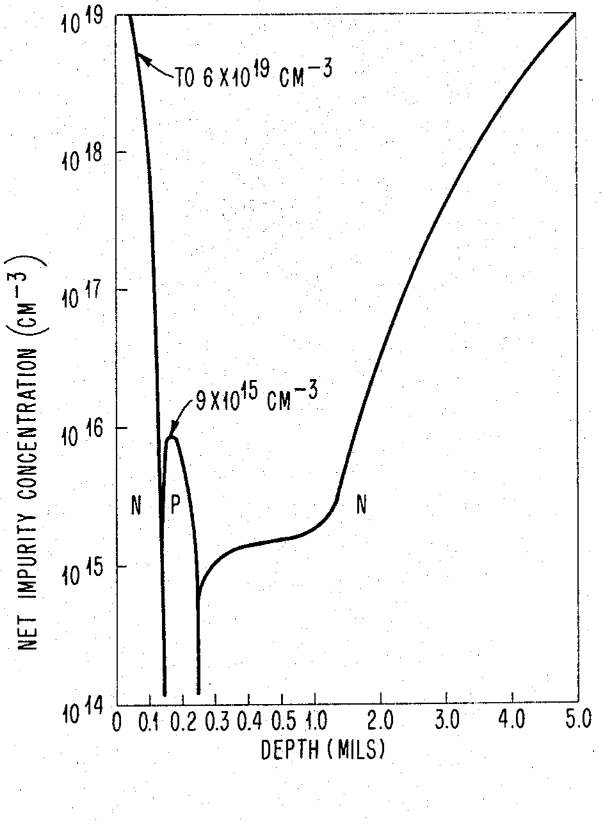

FIG. *5a* is a vertical sectional view of one of the water soluble patches shown in FIG. 4;

FIG. *5b* is a vertical sectional view of the water soluble patch of FIG. *5a* at a next stage in the process wherein a silicon oxide film has been evaporated thereon;

FIG. *5c* is a vertical sectional view of the patch area of FIG. *5a* after the water soluble patch has been removed;

FIG. 6 is a graphic representation of the collector and base diffusion profiles before the emitter junction has been formed; and FIG. 7 is a graphic representation of the net impurity profile of the semiconductor device.

According to an illustrative embodiment of the invention, a triple-diffused transistor is fabricated by the simultaneous diffusion of a P-type impurity (indium to form the collector-base junction) and an N-type impurity (antimony to greatly reduce the collector-bulk resistance) into opposite sides of an etched, 1 ohm-cm., N-type germanium wafer. A "salt process," is used for the third or emitter diffusion and involves the vacuum evaporation of SiO over a pre-evaporated water-soluble patch which, when removed, leaves in the SiO a precisely shaped window through which arsenic is diffused to form the emitter junction.

In high-speed germanium transistors, the collector-junction avalanche breakdown voltage, $BV_{cbo}$, is 2½ to 3 times the open-base breakdown voltage, $BV_{ceo}$. Thus, to ensure a $BV_{ceo}$ of 40 volts, a $BV_{cbo}$ of at least 100 volts must be provided. This breakdown can be obtained with many combinations of initial-material doping, base-diffusion surface concentration ($C_0$) and collector-junction depth ($X_j$). A combination of bulk-doping level of $1.7\times10^{15}$ cm.$^{-3}$ (1 ohm-cm.), base $C_0$ of $1.5\times10^{17}$ cm.$^{-3}$, and collector-junction depth ($X_{jc}$) of 0.25 mil is most practicable.

With the chosen doping levels, and a device geometry of long, thin stripes, optimum speed can be attained using an emitter area of 150 sq. mils. Smaller areas result in loss of speed due to emission-crowding and base-stretching effects, while larger areas result in decreased speed due to capacitance effects. Although this optimum area gives the best speed, it adversely affects saturation-voltage drop, $V_{ce}$. To relieve this problem without a great sacrifice in speed, an emitter area of 300 sq. mils is chosen.

With an emitter area of 300 sq. mils the saturation-voltage drop $V_{ce}$, at a collector current of one ampere, is about one-volt-per-mil thickness of the 1 ohm-cm. collector bulk.

FABRICATION PROCESS

Figures 1, 2, 3:
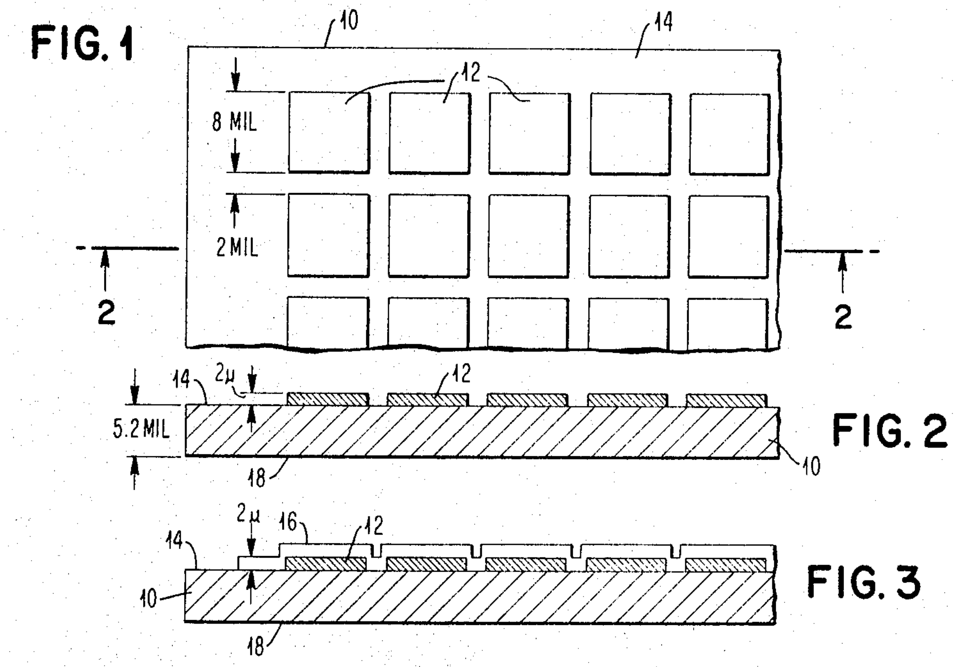
FIG. 1 is a fragmentary plan view of a semiconductor wafer having Ge:Sb patches evaporated thereon.
FIG. 2 is a vertical sectional view of the wafer taken in the direction of the arrows along the line 2—2 in FIG. 1.
FIG. 3 is a vertical sectional view of the wafer of FIG. 1 with a silicon oxide layer evaporated thereon.

The preparation of the wafer for diffusion is described with reference to FIGS. 1, 2, and 3. A 480-mil square wafer 10, of 1 ohm-cm. antimony-doped material is etched to a thickness of 5.2±0.1 mil. A mixture of 98% Ge and 2% Sb by weight is evaporated in "patches" 12 onto one side 14 of the wafer. The evaporated film 12 is about 2 microns thick. The Ge:Sb film is next covered by a blanket-evaporated layer 16 of SiO also about 2 microns thick. The purpose of this film is to prevent out-diffusion of antimony, which would otherwise contaminate the opposite wafer face 18. The "patch" pattern for the Ge:Sb film is used to provide more contact between the virgin material and the SiO film, since the SiO does not adhere too well to the evaporated film.

The wafer is then heated in an open-tube indium-diffusion furnace at 850° C. The indium source is an alloy of 97% Sn and 3% In by weight contained in a quartz holder. The diffusion is performed for 12 hours giving these indium-diffusion parameters, defined by curve 20 in FIG. 6:

Surface concentration $(C_0)=1.5\times10^{17}$ cm.$^{-3}$
Junction depth $(X_j)=0.25$ mil Simultaneously, antimony diffuses into the side 14 of the wafer from the evaporated Ge:Sb film 12. The wafer thickness is so chosen that at a depth of one mil from the front face the diffused-antimony concentration is equal to the bulk doping level. The antimony profile 22 is also shown in FIG. 6.

The wafer is next prepared for a "planar" arsenic diffusion. The "planar" structure is achieved by using a "salt process." In this process, a water-soluble salt, for example NaCl, is evaporated through a metallic emitter mask onto the indium-diffused side 18 of the wafer 10, as shown in FIG. 4. The thickness of the salt film 24 is about 0.5 mil. The wafer is then covered by a blanket film 26 of SiO about 0.1 mil thick (FIG. *5b*). The SiO film is very thin at the edges 28 of the salt and breaks away very easily when the wafer is agitated ultrasonically in a mild HF solution. This results in an emitter window 30 (FIG. *5c*) with edge resolution of about 0.1 mil.

The emitter diffusion may be an arsenic diffusion performed in a vacuum capsule for 30 minutes at 700° C. FIG. 7 shows the results of this diffusion, with the following parameters:

Surface concentration $(C_0)=6\times10^{19}$ cm.$^{-3}$
Emitter junction depth $(X_{je})=0.15$ mil
Base width $(W_B)=0.10$ mil FIG. 7 also shows the net impurity profile.

The SiO films from both sides of the wafer are removed by soaking the wafer in HF for a few minutes. All ohmic contacts are simultaneously evaporated through a metal mask. The contact material—98% Ag:2% In by weight—is evaporated onto the substrate at 430° C., and is microalloyed during the evaporation. The wafer is then scribed, moat-etched to delineate the active collector area, and broken into dies. These are soldered to headers, and 1.2 mil gold wires are bonded to the ohmic contacts and to the header leads. Electrolytic etching and capping complete the fabrication process.

EXPERIMENTAL RESULTS

The effectiveness of the back diffusion can be seen most clearly in the measurement of $V_{ce}$. Table 1 shows the effect of wafer thickness on saturation voltage drop $V_{ce}$. The measurements were made with $I_c=1$ amp and $I_b=0.1$ amp. These results show a high degree of uniformity of the back diffusion as well as excellent reproducibility from run to run. Reduction of $V_{ce}$ by the back diffusion is about 75% of what could be ideally realized by an abrupt resistivity change in the collector bulk—provided such an abrupt change were possible in a germanium NPN structure.

*Table 1.—Effect of wafer thickness on $V_{ce}$*

| Number of Units in Run | Wafer Resistivity (ohm-cm.) | Wafer Thickness (mils) | $V_{ce}$ at $I_c$=1 amp, $I_b$=0.1 amp (volts) | | |
|---|---|---|---|---|---|
| | | | Min. | Med. | Max. |
| 40 | 1.0 | 5.2 | 0.48 | 0.53 | 0.69 |
| 19 | 1.0 | 6.1 | 1.30 | 1.40 | 1.80 |
| 35 | 1.0 | 5.4 | 0.52 | 0.64 | 0.85 |
| 46 | 1.0 | 5.2 | 0.45 | 0.52 | 0.55 |

The experimental results as to transient response are near the theoretical limits. Slight improvement, in the order of 10 to 20% may be achieved by utilizing narrower emitter stripes.

While the invention has been particularly shown and described with reference to a preferred embodiment thereof, it will be understood by those skilled in the art that various changes in form and details may be made therein without departing from the spirit and scope of the invention.

What is claimed is:

1. A process for the diffusion of an impurity into a semiconductive wafer comprising the steps of:

evaporating a semiconductive film doped with an impurity onto one face of the semiconductive wafer, said film comprised of the same semiconductor material as the wafer;

covering said film with a protective silicon oxide layer; and heating the wafer to thereby cause diffusion of the impurity into the wafer.

2. The method of fabricating a semiconductor device comprising the steps of:

evaporating a semiconductor film doped with a first impurity onto one face of a semiconductive wafer comprised of the same semiconductive material as the film;

covering said film with a protective silicon oxide layer; and heating the wafer in a diffusion furnace wherein the diffusion source contains a second impurity;

whereby back diffusion of said first impurity is achieved at the diffusion temperature simultaneously with the diffusion of the second impurity into the opposite face of the semiconductor wafer.

3. The method of fabricating a semiconductor device comprising the steps of:

evaporating a semiconductor film onto one face of a semiconductive wafer, wherein the evaporation source comprises a first impurity mixed with a carrier material of the same material as the semiconductive wafer;

covering said evaporated film with a protective layer; and diffusing a second impurity into the opposite face of the wafer whereby the first impurity is simultaneously diffused into said wafer at the diffusion temperature.

4. The method of fabricating a semiconductor device comprising the steps of:

evaporating a germanium-antimony mixture onto a first side of a germanium wafer in the form of separate film patches;

covering said patches with a silicon oxide protective layer to thereby prevent out diffusion of antimony and its subsequent contamination of the unprotected areas of said wafer; and heating the wafer in an indium diffusion furnace wherein the diffusion source is an alloy of tin and indium whereby antimony diffuses into said first side of said wafer simultaneously with the diffusion of the indium.

5. The method of fabricating a semiconductor device comprising the steps of:

evaporating a 98% germanium and 2% antimony by weight mixture onto a first side of a germanium wafer in the form of separate film patches;

covering said patches with a silicon oxide protective layer two microns thick to thereby prevent out diffusion of antimony and its subsequent contamination of the unprotected areas of said wafer; and heating the wafer in an indium diffusion furnace at a temperature of about 850° C. wherein the diffusion source is an alloy of 97% tin and 3% indium by weight for a time period of about 12 hours, whereby antimony diffuses into said first side of said wafer simultaneously with the diffusion of the indium.

6. The method of fabricating a semiconductor device comprising the steps of:

evaporating a 98% germanium and 2% antimony by weight mixture onto a first side of a germanium wafer in the form of separate film patches;

covering said patches with a silicon oxide protective layer about two microns thick to thereby prevent out diffusion of antimony and its subsequent contamination of the unprotected areas of said wafer;

heating the wafer in an indium diffusion furnace at a temperature of about 850° C. wherein the diffusion source is an alloy of 97% tin and 3% indium by weight for a time period of about 12 hours, whereby antimony diffuses into said first side of said wafer simultaneously with the diffusion of the indium;

evaporating a wafer soluble salt through metallic emitter masks onto the second side of said wafer to a thickness of about .15 mil;

covering the second side of said wafer with a thin blanket film of silicon oxide;

agitating said wafer in a mild HF solution to cause said film to break away at the unmasked areas; and diffusing arsenic into the exposed areas for about 30 minutes at about 700° C.

References Cited by the Examiner

UNITED STATES PATENTS 2,873,222 2/1959 Derick et al. -------- 148—189
2,981,645 4/1961 Tucker ------------ 148—189
3,064,167 11/1962 Hoerni ------------ 148—189

DAVID L. RECK, *Primary Examiner.*

R. O. DEAN, *Assistant Examiner.*